United States Patent
Yang (10) Patent No.: US 12,153,820 B2
(45) Date of Patent: Nov. 26, 2024

(54) METHOD OF PERFORMING WEAR-LEVELING OPERATION IN FLASH MEMORY AND RELATED CONTROLLER AND STORAGE SYSTEM

(71) Applicant: Silicon Motion, Inc., Hsinchu County (TW)

(72) Inventor: Tzu-Yi Yang, Hsinchu County (TW)

(73) Assignee: Silicon Motion, Inc., Hsinchu County (TW)

(*) Notice: Subject to any disclaimer, the term of this patent is extended or adjusted under 35 U.S.C. 154(b) by 0 days.

(21) Appl. No.: 17/206,147

(22) Filed: Mar. 19, 2021

(65) Prior Publication Data

US 2022/0300184 A1  Sep. 22, 2022

(51) Int. Cl.
G06F 3/06 (2006.01)
G11C 11/56 (2006.01)
G11C 16/16 (2006.01)
G11C 16/34 (2006.01)

(52) U.S. Cl.
CPC .......... *G06F 3/0652* (2013.01); *G06F 3/0616* (2013.01); *G06F 3/064* (2013.01); *G06F 3/0653* (2013.01); *G06F 3/0679* (2013.01); *G11C 16/16* (2013.01); *G11C 16/349* (2013.01); *G11C 11/56* (2013.01)

(58) Field of Classification Search
CPC ...... G06F 3/0652; G06F 3/0616; G06F 3/064; G06F 3/0653; G06F 3/0679; G11C 16/16; G11C 16/349; G11C 11/56
USPC ........................................................ 711/103
See application file for complete search history.

(56) References Cited

U.S. PATENT DOCUMENTS

| 8,725,931 B1 | 5/2014 | Kang |
| 9,405,670 B2 | 8/2016 | Pan |
| 9,645,922 B2 | 5/2017 | Ouyang |
| 9,864,526 B2 | 1/2018 | Koo |
| 9,898,404 B2 | 2/2018 | Huang |

(Continued)

FOREIGN PATENT DOCUMENTS

| CN | 102646447 A | 8/2012 |
| CN | 106547703 A | 3/2017 |

(Continued)

OTHER PUBLICATIONS

Yang, the specification, including the claims, and drawings in the U.S. Appl. No. 17/206,137, filed Mar. 19, 2021.

(Continued)

*Primary Examiner* — Gautam Sain
*Assistant Examiner* — Wei Ma
(74) *Attorney, Agent, or Firm* — Winston Hsu (57) ABSTRACT

A method of performing a wear-leveling operation in a flash memory includes: determining a block age for each of a plurality of blocks in the flash memory according to a number of erase operations that have been performed on the flash memory after the block is erased; selecting one or more candidate source blocks from the plurality of blocks by comparing block ages of the plurality of blocks with an age limit; determining a source block from the one or more candidate source blocks according to erase counts or block ages of the one or more candidate source blocks; and performing the wear-leveling operation on the source block.

9 Claims, 9 Drawing Sheets

(56) References Cited

U.S. PATENT DOCUMENTS

| | | | |
|---|---|---|---|
| 2004/0177212 A1* | 9/2004 | Chang | G11C 16/349 711/103 |
| 2007/0061502 A1* | 3/2007 | Lasser | G11C 11/5621 711/103 |
| 2008/0147998 A1* | 6/2008 | Jeong | G11C 16/3495 711/161 |
| 2010/0100663 A1* | 4/2010 | Kao | G06F 12/0246 711/E12.008 |
| 2012/0213005 A1 | 8/2012 | Lee | |
| 2015/0046635 A1* | 2/2015 | Fitzpatrick | G06F 11/008 711/103 |
| 2015/0169230 A1 | 6/2015 | Asnaashari | |
| 2015/0261671 A1 | 9/2015 | Chu | |
| 2016/0092120 A1* | 3/2016 | Liu | G06F 3/0629 711/103 |
| 2016/0179386 A1 | 6/2016 | Zhang | |
| 2017/0168951 A1 | 6/2017 | Kanno | |
| 2017/0242790 A1 | 8/2017 | O'Krafka | |
| 2017/0255405 A1 | 9/2017 | Zettsu | |
| 2017/0285945 A1 | 10/2017 | Kryvaltsevich | |
| 2017/0286288 A1 | 10/2017 | Higgins | |
| 2018/0267705 A1* | 9/2018 | Liu | G06F 3/0679 |
| 2018/0275915 A1 | 9/2018 | Ke | |
| 2019/0121725 A1 | 4/2019 | Sehgal | |
| 2019/0227927 A1 | 7/2019 | Miao | |
| 2020/0097403 A1 | 3/2020 | Saxena | |
| 2020/0110698 A1 | 4/2020 | Kanno | |
| 2020/0257621 A1* | 8/2020 | Pletka | G06F 3/0688 |
| 2021/0173558 A1 | 6/2021 | Kashyap | |
| 2021/0224187 A1 | 7/2021 | Um | |
| 2021/0405900 A1* | 12/2021 | Kurita | G06F 3/0644 |

FOREIGN PATENT DOCUMENTS

| | | |
|---|---|---|
| CN | 110058794 A | 7/2019 |
| CN | 110489354 A | 11/2019 |
| CN | 111045956 A | 4/2020 |
| CN | 111930301 A | 11/2020 |
| TW | 201015581 | 4/2010 |
| TW | 1376600 | 11/2012 |
| TW | 201342057 A | 10/2013 |
| TW | I519950 B | 2/2016 |
| TW | 201915742 A | 4/2019 |
| TW | 201928678 A | 7/2019 |
| TW | I670594 B | 9/2019 |
| TW | 202011186 A | 3/2020 |
| TW | 202024901 A | 7/2020 |

OTHER PUBLICATIONS

Yang, the specification, including the claims, and drawings in the U.S. Appl. No. 17/206,149, Filing Date: Mar. 19, 2021.

* cited by examiner

METHOD OF PERFORMING WEAR-LEVELING OPERATION IN FLASH MEMORY AND RELATED CONTROLLER AND STORAGE SYSTEM

BACKGROUND OF THE INVENTION

1. Field of the Invention

The present invention relates to flash memory, and more particularly, to method of performing wear-leveling operation in flash memory and related controller and storage system.

2. Description of the Prior Art

A flash memory has individually erasable blocks, each of which can be put through a limited number of P/E (program/erase) cycles before prematurely wearing out or exceeding its endurance. Therefore, the flash memory relies on a wear-leveling operation to prevent intensive erasures from occurring on specific blocks and spread erasures more evenly over all blocks of the flash memory.

Typically, a conventional static wear-leveling operation is triggered as long as a difference between a highest erase count of spare blocks and a lowest erase count in the flash memory exceeds a threshold. At this time, blocks having low erase counts are selected as source blocks and data in these blocks is deemed as cold (i.e., infrequently accessed). On the other hand, spare blocks with high erase counts are selected as destination blocks and data in these blocks is deemed as hot (i.e., frequently accessed). Accordingly, the deemed "cold data" will be moved to destination blocks and the deemed "hot data" will then be programmed to the source blocks. It is expected that there will be relatively large increases in the erase counts of the source blocks (since they now contain hot data) and relatively small increases in the erase counts of the destination blocks (since they now contain cold data), thereby leveling erase count differences therebetween. However, such manner may lead to an unfavorable result.

Figure 1A:
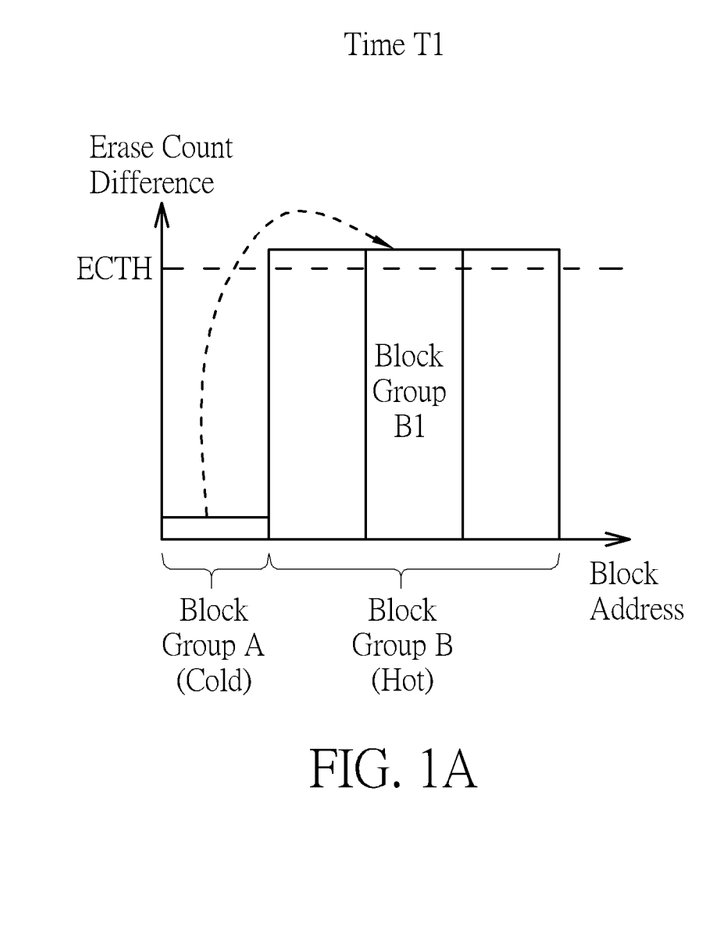
FIG. 1A and FIG. 1B illustrates how a wear-leveling operation is performed in a conventional art.
Figure 1B:
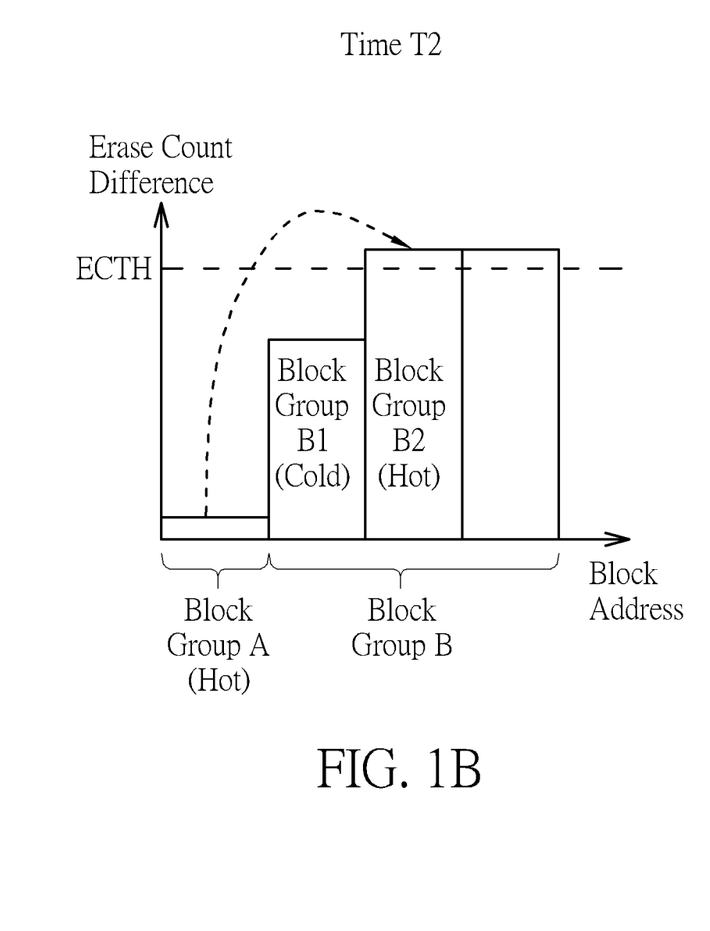

Considering a situation illustrated by FIG. 1A, a small number of blocks (i.e., block group A) have low erase count differences and contain cold data, while a large number of blocks (i.e., block group B) have high erase count differences and contain cold data. Then, a wear-leveling operation is trigger at time T1 as erase count differences of the block group B reach an erase count difference threshold ECTH. Since blocks of the block group A has low erase counts, they are selected as source blocks, and cold data in the block group A will be moved to several blocks (i.e., block group B1) in the block group B. Accordingly, hot data will be moved to the block group A for leveling erase count differences. As shown by FIG. 1B, the wear-leveling operation is triggered at time T2 as the erase count difference threshold ECTH has been reached again. At this time, as the erase counts of the blocks in the block group A are still pretty low, data in the block group A will be mistakenly deemed as cold data and moved to blocks (i.e., block group B2) in the block group B.

As a consequence, the "hot data" that is previously programmed to the block group A1 at time T1, is moved to the blocks of the block group B2 with high erase counts. Therefore, the erase counts of the block group B2 will continually rise up, thereby failing to level the erase count differences. In view of above, it can be understood that the erase counts of the blocks cannot always reflect temperature of data. Selecting a source block of the wear-leveling operation only relying on erase counts may lead to a meaninglessly data movement, degrading the efficiency of wear-leveling and making write amplification worse. Thus, it is necessary to provide a method of selecting a source block of wear-leveling operation.

SUMMARY OF THE INVENTION

In view of this, it is one object of the present invention to provide a method of performing wear-leveling operation. Embodiments of the present invention provide manners to judge temperature of data more precisely. First, the present invention maintains a block age table for recording block ages of blocks in the flash memory. Second, the present invention sets an age limit. Once a block having block age exceeds the age limit, it is deemed that the block has not undergone the erase operation for a long time and the block is likely to contain cold data. Such block is selected as one of candidate source blocks for wear-leveling operation. With the present invention, temperatures of data can be judged more accurately, thereby to avoid selecting block containing hot data as a source block. As such, the present invention improves the efficiency of wear-leveling.

According to one embodiment, a method of performing a wear-leveling operation in a flash memory is provided. The method comprises: determining a block age for each of a plurality of blocks in the flash memory according to a number of erase operations that have been performed on the flash memory after the block is erased; selecting one or more candidate source blocks from the plurality of blocks by comparing block ages of the plurality of blocks with an age limit; determining a source block from the one or more candidate source blocks according to erase counts or block ages of the one or more candidate source blocks; and performing the wear-leveling operation on the source block.

According to one embodiment, a controller for controlling a flash memory and performing a wear-leveling operation on the flash memory on is provided. The controller comprises: a storage unit and a processing unit. The storage unit is configured to store information. The processing unit is configured to execute program codes and refer to information stored in the flash memory or in the storage unit so as to perform following operations of: determining a block age for each of a plurality of blocks in the flash memory according to a number of erase operations that have been performed on the flash memory after the block is erased; selecting one or more candidate source blocks from the plurality of blocks by comparing block ages of the plurality of blocks with an age limit; determining a source block from the one or more candidate source blocks according to erase counts or block ages of the one or more candidate source blocks; and performing the wear-leveling operation on the source block.

According to one embodiment, a storage system is provided. The storage system comprises: a flash memory; and a controller. The controller is utilized for controlling the flash memory and performing a wear-leveling operation on the flash memory. The controller is configured to: determining a block age for each of a plurality of blocks in the flash memory according to a number of erase operations that have been performed on the flash memory after the block is erased; selecting one or more candidate source blocks from the plurality of blocks by comparing block ages of the plurality of blocks with an age limit; determining a source block from the one or more candidate source blocks according to erase counts or block ages of the one or more candidate source blocks; and performing the wear-leveling operation on the source block.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

OVERVIEW

Figure 2:
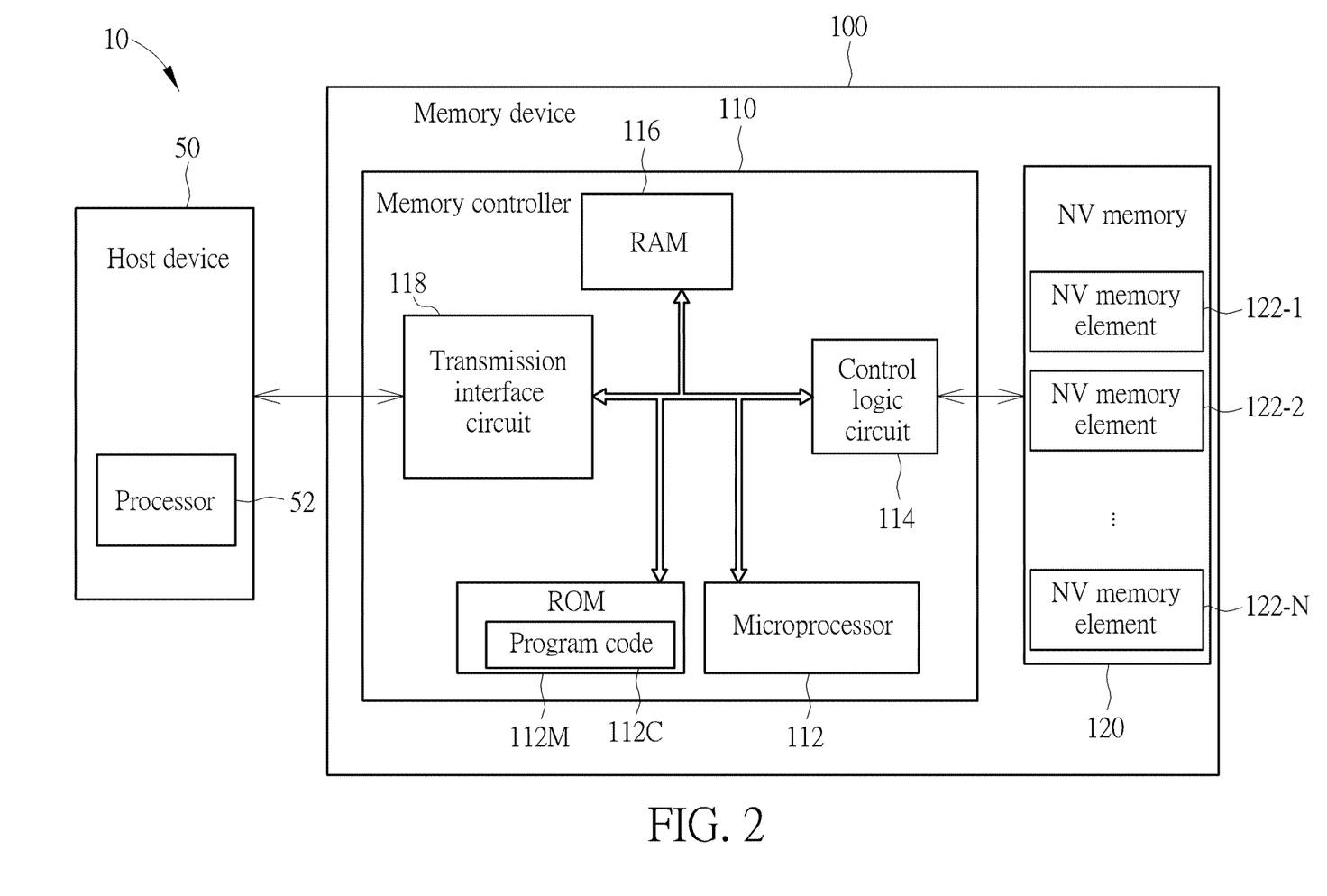
FIG. 2 illustrates a schematic diagram of an electronic device according to one embodiment of the present invention.

FIG. 1 is a diagram illustrating an electronic device 10 according to an embodiment of the present invention, where the electronic device 10 comprises a host device 50 and a memory device 100. The host device 50 may comprise: at least one processor 52 configured to control operations of the host device 50. Examples of the host device 50 may include, but are not limited to: a smartphone, a tablet computer, a wearable device, a personal computer such as a desktop computer and a laptop computer, an imaging device such as a digital still camera or a video camera a game console, a car navigation system, a printer, a scanner or a server system. Examples of the memory device 100 may include, but are not limited to: a portable memory device (such as a memory card conforming to SD/MMC, CF, MS, XD or UFS specifications), a solid state drive (SSD) and various embedded storage device (such as an embedded storage device conforming to UFS or EMMC specifications)

According to various embodiments, the memory device 100 may comprise a controller such as a memory controller 110, and may further comprise a non-volatile (NV) memory 120. The NV memory 120 is configured to store information. The NV memory 120 may comprise at least one NV memory element (e.g. one or more NV memory elements), such as a plurality of NV memory elements 122_1-122_N. For example, the NV memory 120 may be a flash memory, and the NV memory elements 122_1-122_N may be a plurality of flash memory chips or a plurality of flash memory dies, respectively, but the present invention is not limited thereto. In addition, the NV memory 120 may comprise memory cells having a two-dimensional structure or may comprise memory cells having a three-dimensional structure.

As shown in FIG. 2, the memory controller 110 may comprise a processing circuit such as a microprocessor 112, a storage component such as a read-only memory (ROM) 112M, a control logic circuit 114, a garbage collection (GC) operation management engine 115, a volatile memory 116 and a transmission interface circuit 118, where at least one portion (e.g. a portion or all) of these components may be coupled to one another through a bus. The volatile memory 116 is implemented by a random access memory (RAM), for example, the volatile memory 116 may be a static RAM (SRAM). The volatile memory 116 may be configured to provide internal storage space to the memory controller 110, for example, temporarily storing information. In addition, the ROM 112M of this embodiment is configured to store a program code 112C, and the microprocessor 112 is configured to execute the program code 112C to control access of the NV memory 120. Alternatively, the program code 112C may be stored in the NV memory 120.

The memory controller 110 controls reading, writing and erasing of the NV memory 120 through a control logic circuit 114. In addition, the memory controller 110 could perform writing of user data based on host commands from the host device 50 and writing of valid data which is read from the NV memory 120 by the garbage collection and or wear-leveling concurrently. The control logic circuit 114 may be further configured to control the NV memory 120 and comprise an Error Correction Code (ECC) circuit (not shown), to perform data protection and/or error correction, but the present invention is not limited thereto. The transmission interface circuit 118 may conform to a specific communications specification (such as Serial Advanced Technology Attachment (SATA) specification, Universal Serial Bus (USB) specification, Peripheral Component Interconnect Express (PCIE) specification, embedded Multi Media Card (eMMC) specification, or Universal Flash Storage (UFS) specification) and may perform communications with the host 50 according to the specific communications specification.

Typically, the host device 50 may access the memory device 100, indirectly, through transmitting host commands and corresponding logic addresses to the memory controller 110. The memory controller 110 receives the host commands and the logic addresses, and translates the host commands to memory operation commands, and further controls the NV memory 120 with the memory operation commands to perform read, write or erase operations upon memory units or data pages having physical addresses within the NV memory 120, where the physical addresses corresponds to the logic addresses. When the memory controller 110 performs an erase operation on any NV memory element 122_k within the plurality of NV memory elements 122_1-122_N, at least one block of the NV memory element 122_k may be erased. In addition, each block of the NV memory element 122_k may comprise multiple pages, and an access operation (e.g. read or write) may be performed on one or more pages.

As mentioned above, an erase count of a block cannot precisely reflect data in the block is cold or not. Therefore, embodiments of the present invention provide methods of distinguishing blocks having cold data. Accordingly, the blocks having cold data would be selected as candidate source blocks for wear-leveling. The memory controller 110 would first determine block ages for blocks in the NV memory 120. The block age is intended to estimate how long a block has not been erased. If a block has not been erased for a long time, this block is very likely to contain cold data. Therefore, the memory controller 110 will determine whether a block whose block age exceeds a predetermined age limit. If so, the block will be treated as potentially containing cold data and then selected as a candidate source block for wear-leveling.

To determine block ages for blocks in the NV memory 120, the memory controller 110 maintains at least one block age table. The block age table records a block erase stamp BES for each of blocks (e.g. a portion or all of physical blocks of the NV memory 120) in the NV memory 120. In addition, the memory controller 110 also records a system erase stamp SES by counting a number of times that erase operations have been performed over the blocks in the NV memory 120. The system erase stamp SES is updated in response to each time the erase operation is performed on the NV memory 120, while the block erase stamp BES of a block is updated according to an instant value of the system erase stamp SES at the time the block is erased. As the system erase stamp SES is updated according to the number of times that the erase operation is performed on the NV memory 120, it substantially reflects wear-out of the NV memory 120. In addition, as the block erase stamp BES is updated according to the instant value of the system erase stamp SES, it can substantially reflect the time point when the block is erased. By subtracting the value the block erase stamp BES of a certain block from the value of the system erase stamp SES, the block age of the certain block can be estimated accordingly. The block age can reflect how long a block has not been erased or an elapsed time of the block after being erased. The older the block, the more likely it is to contain cold data.

Figure 3:
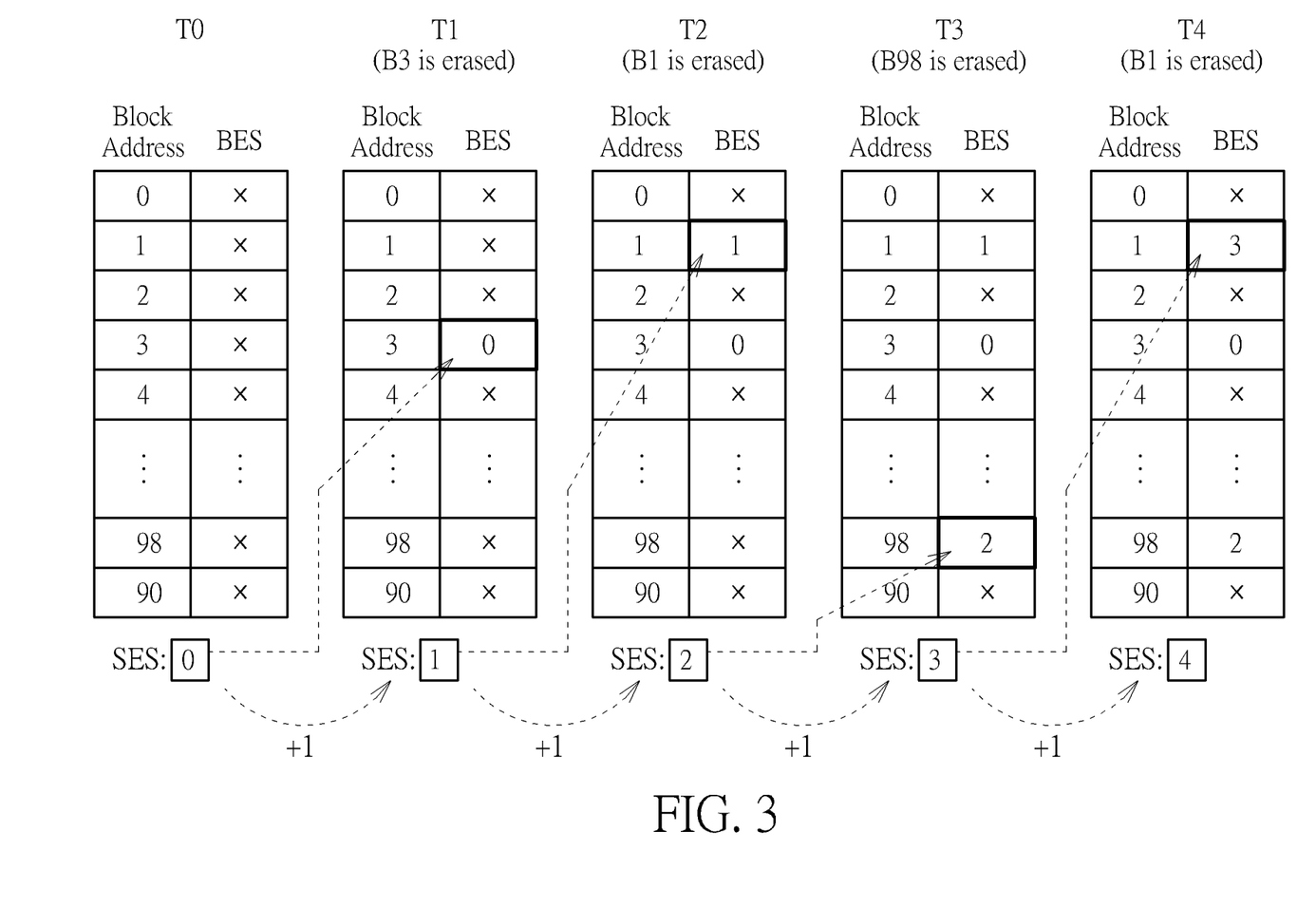
FIG. 3 illustrates how to maintain a block age table according to one embodiment of the present invention.

FIG. 3 illustrates how a block age table is maintained by the memory controller 110 according to one embodiment of the present invention. In the embodiment, it is assumed that there are 100 blocks (i.e., B0-B99) in the NV memory 120. Please note that, blocks B0-B99 may not be all the blocks of the NV memory 120. In other words, the block age table may be only used to estimate the block ages of certain blocks in the NV memory 120.

Referring back to FIG. 3, a block B3 is erased at time T1. When the block B3 is erased, an instant value of the system erase stamp SES is 0. Therefore, the block erase stamp BES_B3 of the block B3 will be updated to 0. Accordingly, the system erase stamp SES will be increased by 1, i.e., from 0 to 1, due to the erase operation on the block B3. At time T2, a block B1 is erased. When the block B1 is erased, an instant value of the system erase stamp SES is 1. Therefore, the block erase stamp BES_B1 of the block B1 will be updated to 1. Due to the erase operation on the block B1, the system erase stamp SES will updated from 1 to 2. At time T3, a block B98 is erased. When the block B98 is erased, an instant value of the system erase stamp SES is 2. Therefore, the block erase stamp BES_B98 of the block B98 will be updated to 2. Due to the erase operation on the block B98, the system erase stamp SES will updated from 2 to 3. At time T4, a block B1 is erased again. When the block B1 is erased, an instant value of the system erase stamp SES is 3. Therefore, the block erase stamp BES_B1 of the block B1 will be updated to 3. Due to the erase operation on the block B1, the system erase stamp SES will updated from 3 to 4. As the block B1 is erased again at time T4, the block age BA_B1 of the block B1 is 1 (i.e., 4−3=1), which becomes younger than before.

Figure 4:
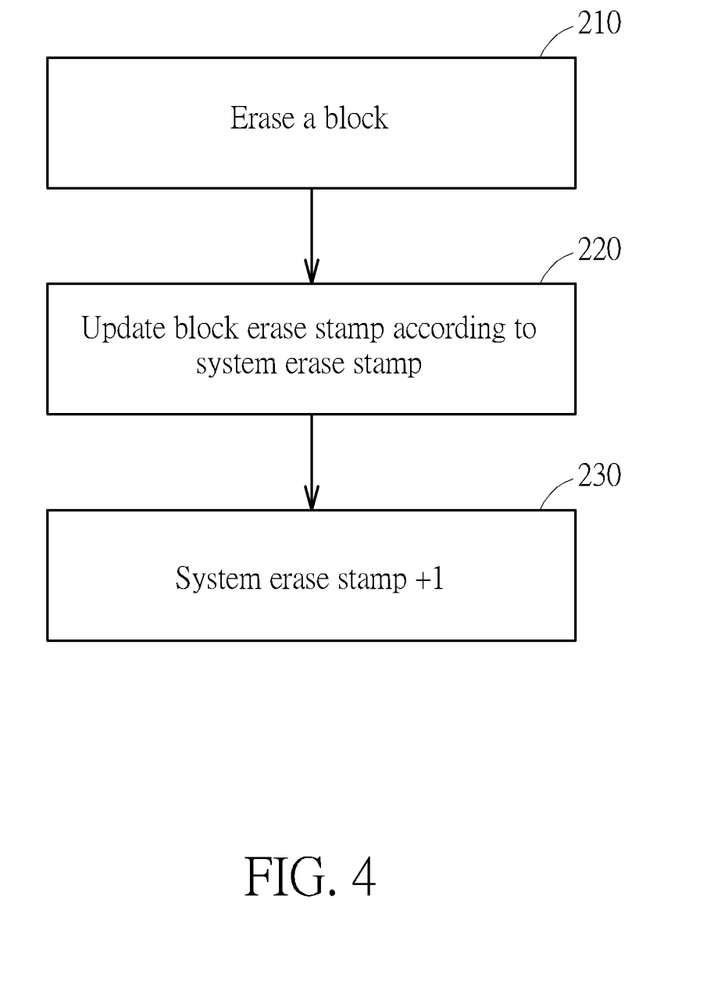
FIG. 4 illustrates a flow chart of a method of maintaining a block age table according to one embodiment of the present invention.

FIG. 4 illustrates a flow chart regarding how to maintain the block age table as mentioned above. At step 310, a block is erased. At step 320, the block erase stamp of the block is updated according to the instant value of the system erase stamp. At step, 320, the system erase stamp is updated in response to block erasing. According to the block age table BAT, the memory controller 110 could determine a block age BA_k of a block Bk by calculating a difference between the instant value of the system erase stamp CES and the block erase stamp BES_k, where i.e., BA_k=(CES)−(BES_Bk).

Based on the block age table BAT, the memory controller 110 can determine the block ages of the blocks any time. Accordingly, the memory controller 110 keeps monitoring the block ages of the blocks. Once a block having the block age exceeds an age limit, it means the block has not been erased for a long time. In view of this, the memory controller 110 selects this block as a candidate source block for wear-leveling operation since this block is likely to have cold data.

According to various embodiments of the present invention, the memory controller 110 may set the age limit according to changes of erase count differences of blocks in NV memory 120. Specifically, the memory controller 110 records an erase count for each of the blocks, where the erase count indicates a number of times the block has been erased. The memory controller 110 subtracts the lowest erase count associated with the NV memory 120 from the erase count of each block to determine an erase count difference of each block. In the following, several manners for determining the age limit are explained.

Figure 5A:
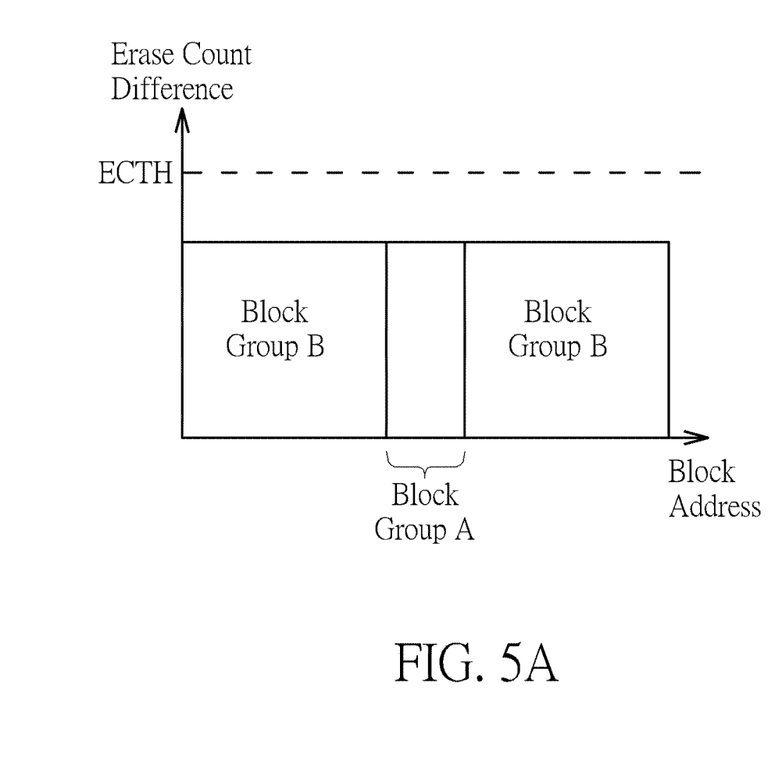
FIG. 5A and FIG. 5B illustrates how to set an age limit according to a first embodiment of the present invention.
Figure 5B:
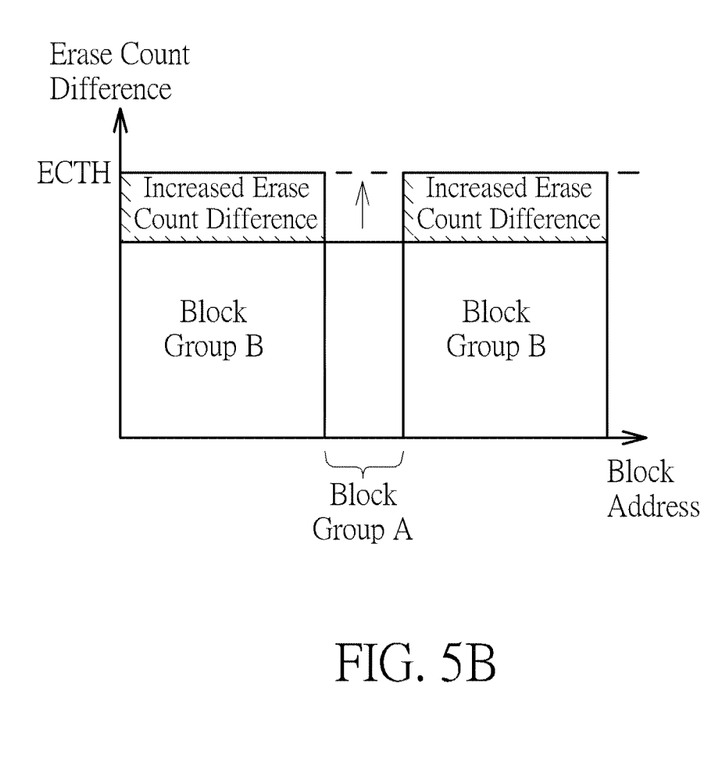

Considering a situation shown by FIG. 5A and FIG. 5B, which illustrate distribution of erase count differences over blocks of the NV memory 120. As shown by FIG. 5A, there are a small number of blocks (i.e., block group A) that may contain cold data and a large number of blocks (i.e., block group B) that may contain hot data in the NV memory 120. After a certain period of time, the distribution of erase count differences changes as shown by FIG. 5B, where blocks in the block group B have significant increases in their erase count differences. Such situation may be resulted from that the blocks of the block group A have experienced very few times of erase operations but the blocks of the block group B have experienced a lot of times of erase operations. In view of this, it is highly possible that data in the blocks of the block group A is cold data.

Thus, the memory controller 110 could set the age limit according to multiples of the total block number of the NV memory 120, i.e., the age limit is: TBN*N, where TBN is the total block number of NV memory 120 and N is greater than or equal to 1. This is because when the block number of the block group B is large enough, it approaches the total block number TBN of NV memory 120. Hence, the value "TBN*N" will be pretty close to the total number of times that blocks of the block group B has been averagely erased for N times. If a block age of a block exceeds such age limit, it is obvious that this block has not been erased once but the blocks of the block group B have been erased lots of times. In view of this, it is highly possible that this block contains cold data. Thus, setting the age limit by N times the total block number can accurately distinguish a block having cold data from the block group A (i.e., a small number of blocks).

Figure 6A:
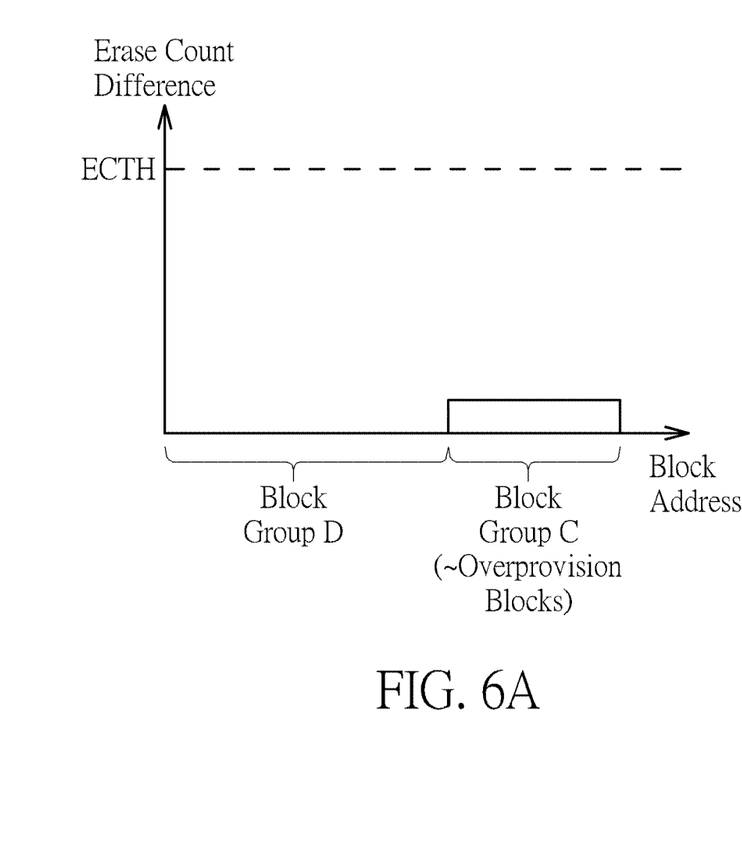
FIG. 6A and FIG. 6B illustrates how to set an age limit according to a second embodiment of the present invention.
Figure 6B:
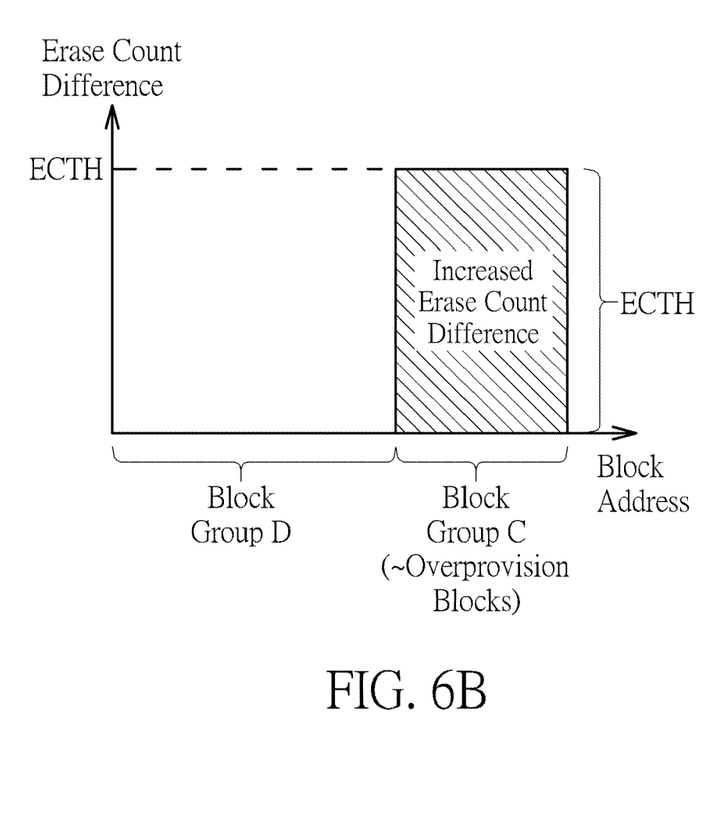

Considering another situation shown by FIG. 6A and FIG. 6B, which illustrate distribution of erase count differences over blocks of the NV memory 120. As shown by FIG. 6A, there are a small number of blocks (i.e., block group C) that may contain hot data and a large number of blocks (i.e., block group D) that may contain cold data. After a certain period of time, the distribution of erase count differences changes as shown by FIG. 6B, where blocks in the block group C have significant increases in their erase count differences, and these erase count differences reach the erase count difference threshold ECTH. Such situation may be resulted from that the blocks of the block group D have experienced very few times of erase operations but the blocks of the block group C have experienced a lot of times of erase operations. In view of this, it is highly possible that data in the blocks of the block group D is cold data.

Thus, the memory controller 110 could set the age limit according to the erase count difference threshold ECTH and the block number OPN of overprovision blocks in the NV memory 120. That is, the age limit is: ECTH*OPN*N, where N is greater than or equal to 1. The block number OPN of the overprovision blocks is used to estimate a minimum value of the real block number of the block group C. If all the blocks in the block group C have increases in their erase count differences as shown by FIG. 6B, it means there will be at least "OPN" blocks having identical increases in their erase count differences. Thus, if a block having the block age exceeds the age limit: "ECTH*OPN*N", it means this block has not been erased once but the blocks of the block group C have experienced a lot of erase operations. In view of this, it can be sure that this block is very likely to contain cold data. Thus, the age limit: "ECTH*OPN*N" can accurately distinguish a block having cold data from the block group D (i.e., a large number of blocks).

According to one embodiment, the erase count difference threshold ECTH can be determined according to a percentage of an expected lifetime program/erase (P/E) cycles of blocks. For example, the erase count difference threshold ECTH can be set according to 10% of an expected lifetime P/E cycles of 3000, i.e., 300 cycles. In addition, for blocks in a single-level cell (SLC) region of the NV memory 120, the erase count difference threshold ECTH can be set higher than that for blocks in a triple-level cell (TLC) region of the NV memory 120 due to differences in their expected lifetime P/E cycles.

Figure 7A:
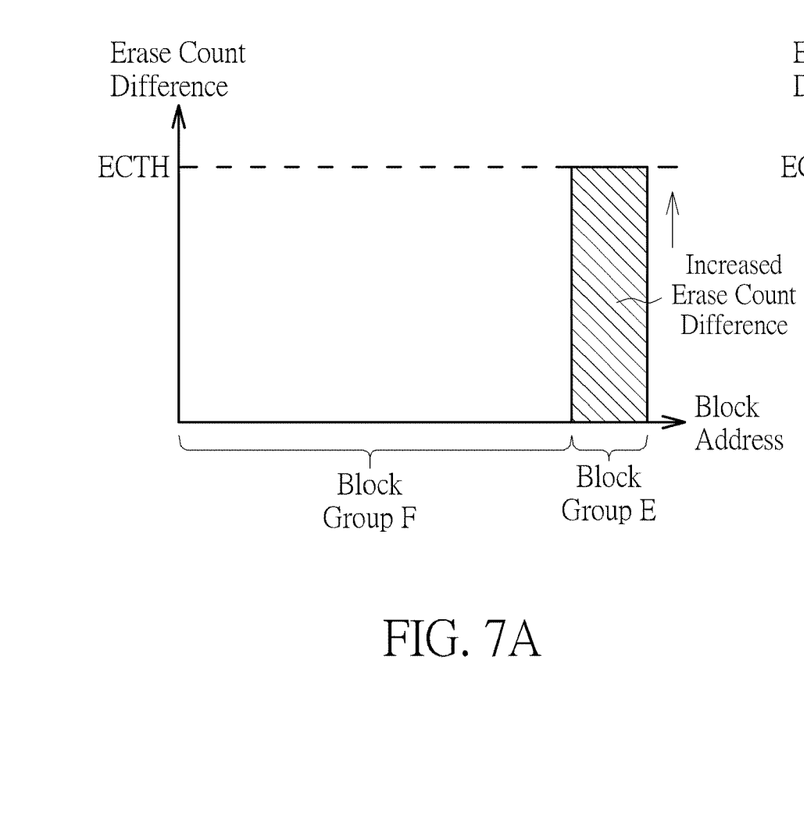
FIG. 7A and FIG. 7B illustrates how to set an age limit according to a third embodiment of the present invention.
Figure 7B:
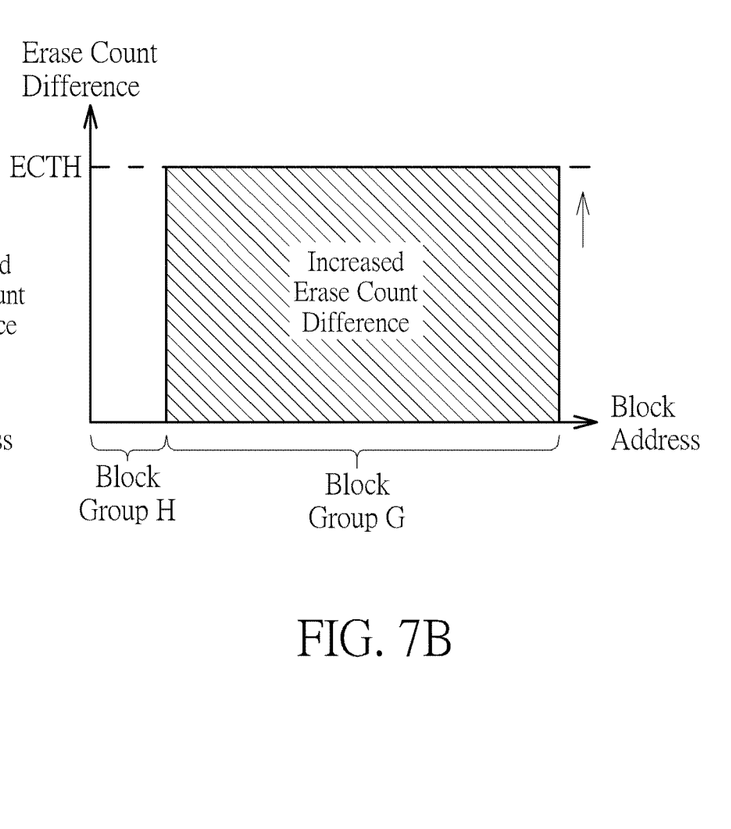

Considering situations shown by FIGS. 7A and 7B, which illustrate distribution of erase count differences over blocks of the NV memory 120. As shown by FIG. 7A, a small number of blocks (i.e., block group E) that may contain hot data, while a large number of blocks (i.e., block group F) have cold data. If blocks of the block group E have significant increases and averagely reach the erase count difference threshold ECTH during a certain period of time. This means blocks of the block group E have experienced a lot of times of erase operations compared to blocks of the block group F. In view of this, the memory controller 110 could set the age limit according to a result of dividing a sum of erase count differences DiffSUM of blocks in the NV flash memory 120 by the erase count difference threshold ECTH, that is, the age limit can be set as: (DiffSUM/ECTH)*N, where N is greater than or equal to 1. As shown by FIG. 7A, the value "DiffSUM/ECTH" will be pretty close to the block number of the block group E. Thus, the value "(DiffSUM/ECTH)*N" will be close to the total number of times that blocks of block group E have been averagely erased for N times. In view of this, if a block having the block age exceeds such age limit, it can be sure that the block is very likely to contain cold data. Thus, the age limit: "(DiffSUM/ECTH)*N" can accurately distinguish a block having cold data from the block group F (i.e., a large number of blocks).

In the case shown by FIG. 7B, the value "DiffSUM/ECTH" will be pretty close to the block number of the block group G (i.e., a large number of blocks that may contain hot data). Thus, the value "(DiffSUM/ECTH)*N" will be close to the total number of times that blocks of block group G have been averagely erased for N times. In view of this, if a block having the block age exceeds such age limit, it can be sure that the block is very likely to contain cold data. Thus, the age limit: "(DiffSUM/ECTH)*N" can accurately distinguish a block having cold data from the block group H (i.e., a small number of blocks).

When the block ages of one or more blocks exceed the age limit, it means the one or more blocks have not been erased for a long time and they are likely to contain cold data. Accordingly, the memory controller 110 could select such blocks as candidate source blocks and then determine a source block for the wear-leveling operation from these candidate source blocks. According to various embodiments, the memory controller 110 could determine the source block differently. In one embodiment, the memory controller 110 could select a block having the oldest block age from the candidate source blocks as the source block. This is because the block age is highly related to the data temperature. The block with the oldest block age is very likely to contain cold data. In another embodiment, the memory controller 110 could select a block having the lowest erase count from the candidate source blocks as the source block. This is because the erase count is also highly related to the data temperature. The block with the lowest erase count is also very likely to contain cold data.

After the source block has been selected, the memory controller 110 starts to perform the wear-level operation on the source block. The wear-level operation will move data in the source block to a free/spare block in the NV memory 120 with the highest erase count. On the other hand, hot data from one or more blocks with high erase counts in the NV memory 120 will be programmed to the source block, thereby to level the erase count differences between blocks in the NV memory 120.

Figure 8:
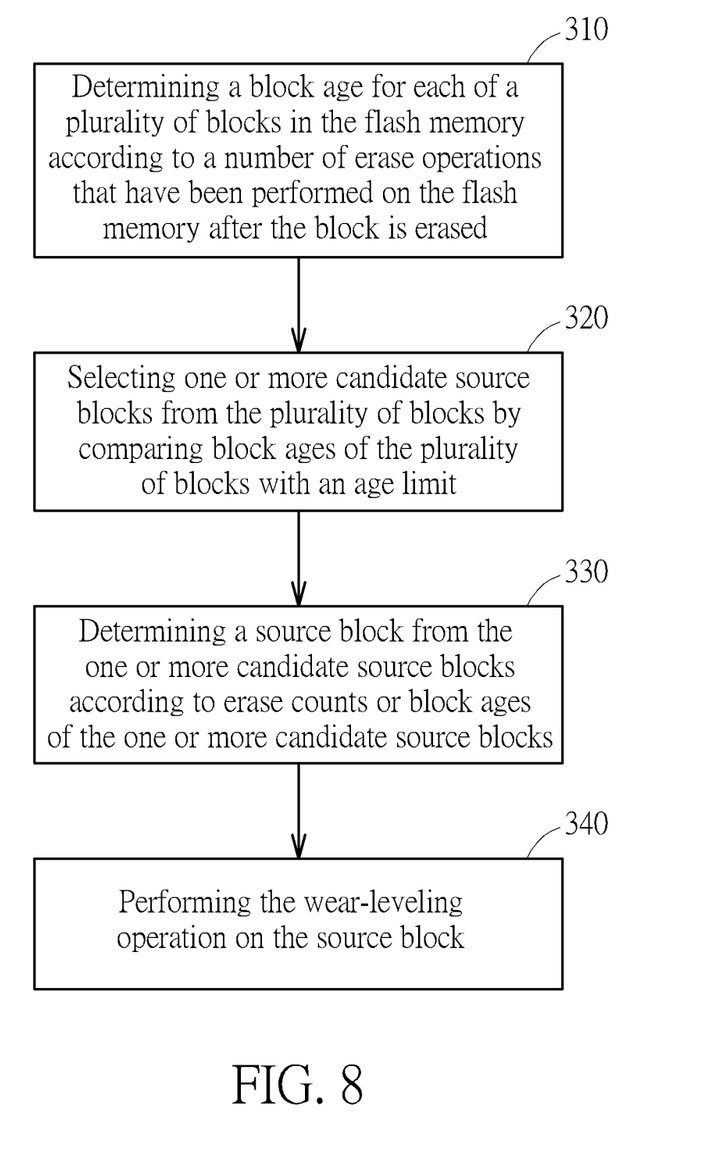
FIG. 8 illustrates a flow chart of a method of performing a wear-leveling operation in a flash memory according to one embodiment of the present invention.

FIG. 6 illustrates a flow of a method of managing a wear leveling operation on a flash memory according to one embodiment of the present invention. The follow includes steps of:

Step 310: determining a block age for each of a plurality of blocks in the flash memory according to a number of erase operations that have been performed on the flash memory after the block is erased;

Step 320: selecting one or more candidate source blocks from the plurality of blocks by comparing block ages of the plurality of blocks with an age limit;

Step 330: determining a source block from the one or more candidate source blocks according to erase counts or block ages of the one or more candidate source blocks; and Step 340: performing the wear-leveling operation on the source block.

As principles and detail operations regarding these steps are explained thoroughly in the above embodiments, further descriptions regarding these steps are omitted here for sake of brevity.

Please note that the term "all the block", "total block number" throughout the above paragraphs may represent a specific group of blocks rather than all physical blocks in the NV memory 120. In addition, methods of determining the block age and determining the age limit may be differently and distinctly implemented with respect to different blocks in the NV memory 120.

Figure 9:
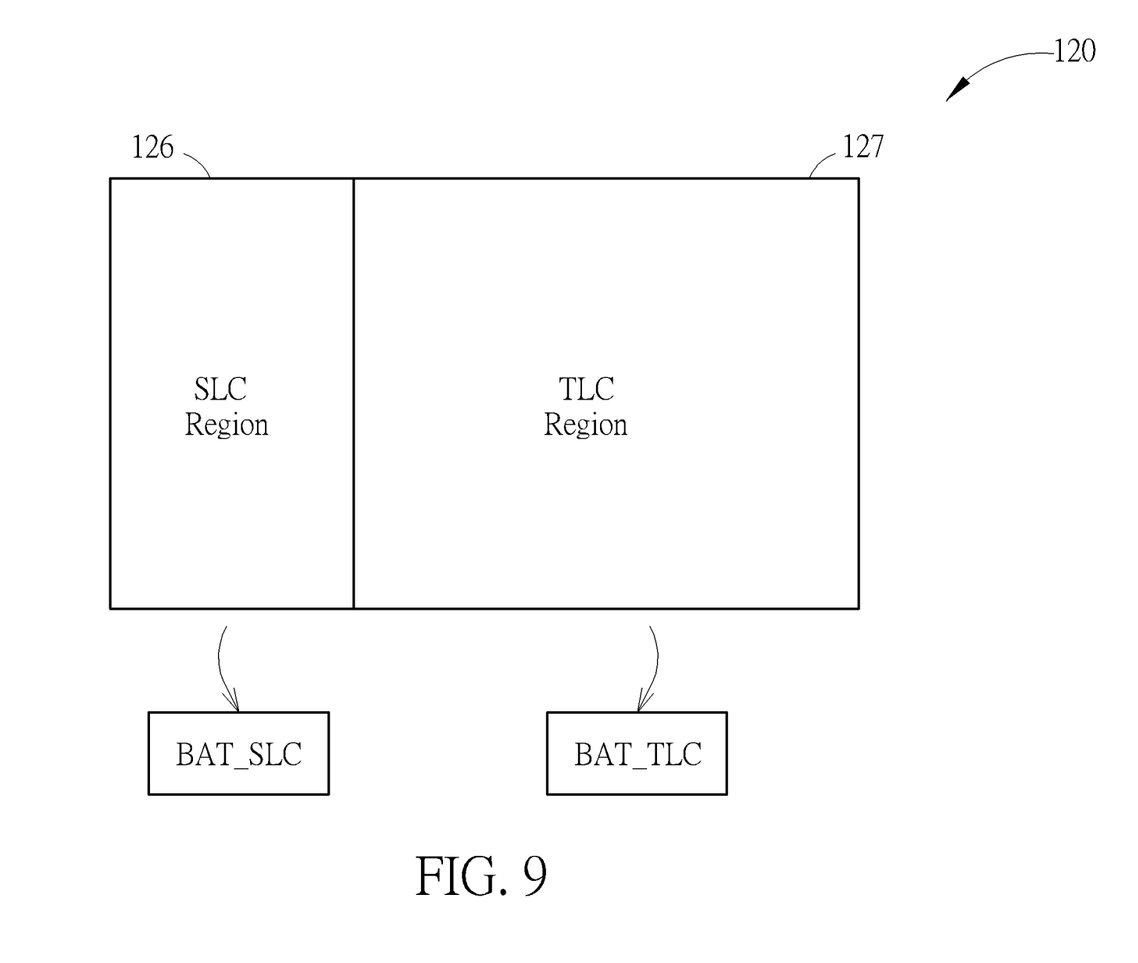
FIG. 9 illustrates maintaining different block age tables for different regions in a flash memory according to one embodiment of the present invention

Please refer to FIG. 9 for further understandings. As shown by FIG. 9, the NV memory 120 may comprise a single-level cell (SLC) region 126 and a Triple-level cell (TLC) region 127. That is, the memory controller 110 could maintain one block age table BAT SLC for blocks in SLC region 126 and another block age table BAT TLC for blocks in TLC region 127. Specially, the memory controller 110 records a first system erase stamp that is updated only when a block in the SLC region 126 is erased and accordingly maintains the block age table BAT SLC, while records a second system erase stamp that is updated only when a block in the TLC region 126 is erased and accordingly maintains the block age table BAT TLC. In other words, an erasure of a block in the SLC region 126 may not lead to the updating of the block age table BAT TLC, and vice versa. In another embodiment, if the SLC region 126 is a dynamic SLC region, both of the first system erase stamp for the SLC region 126 and the second system erase stamp for the TLC region 127 will be updated once a block in either the SLC region 126 or the TLC region 127 is erased.

Furthermore, the age limits for the blocks in the SLC region 126 and the blocks in the TLC region 127 may be different because the SLC blocks and the TLC blocks usually have different erase count difference threshold ECTH due to their different expected lifetime P/E cycles. Additionally, the term "all the block" in the above descriptions may represent either "all the blocks in the SLC region 126" or "all the blocks in the TLC region 127", while the term "total block number" may refer to either "total block number of blocks in the SLC region 126" or "total block number of blocks in the TLC region 127".

In summary, the present invention provides a method of performing a wear-level operation as well as related controller and storage system. In the present invention, a block is selected as a candidate source block for wear-leveling only when its block age exceeds the age limit. Thus, selection of the source block does not just rely on the erase counts of blocks only, which can avoid misjudging data temperature like the conventional art. As such, the present invention improves the efficiency of wear-leveling in the flash memory.

Embodiments in accordance with the present invention can be implemented as an apparatus, method, or computer program product. Accordingly, the present embodiments may take the form of an entirely hardware embodiment, an entirely software embodiment, or an embodiment combining software and hardware aspects that can all generally be referred to herein as a "module" or "system." Furthermore, the present embodiments may take the form of a computer program product embodied in any tangible medium of expression having computer-usable program code embodied in the medium. In terms of hardware, the present invention can be accomplished by applying any of the following technologies or related combinations: an individual operation logic with logic gates capable of performing logic functions according to data signals, and an application specific integrated circuit (ASIC), a programmable gate array (PGA) or a field programmable gate array (FPGA) with a suitable combinational The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It is also noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions. These computer program instructions can be stored in a computer-readable medium that directs a computer or other programmable data processing apparatus to function in a particular manner, such that the instructions stored in the computer-readable medium produce an article of manufacture including instruction means which implement the function/act specified in the flowchart and/or block diagram block or blocks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing a wear-leveling operation in a flash memory, comprising:
   determining a block age for each of a plurality of blocks in the flash memory according to a number of erase operations that have been performed on all of the plurality of blocks in the flash memory after the block is erased, wherein the block age reflects a duration of time that has elapsed since the block was last erased;
   selecting one or more candidate source blocks from the plurality of blocks by comparing block ages of the plurality of blocks with an age limit, comprising:
      determining a calculation result of dividing a sum of erase count differences of blocks in the flash memory by an erase count difference threshold, wherein the calculation result is indicative of the number of blocks containing hot data;
      setting the age limit according a product of an average erase count factor and the calculation result; and
      selecting one or more blocks whose block ages exceed the age limit as the one or more candidate source blocks;
   determining a source block from the one or more candidate source blocks according to either a lowest erase count among erase counts of the one or more candidate source blocks or an oldest block age among block ages of the one or more candidate source blocks; and
   performing the wear-leveling operation on the source block.

2. The method of claim 1, wherein the flash memory comprises a single-level cell (SLC) region and a triple-level cell (TLC) region, and the step of determining the block age for each of the plurality of blocks comprises:

recording a first system erase stamp and updating it only in response to erase operations performed over blocks in the SLC region; and recording a second system erase stamp and updating it only in response to erase operations performed over blocks in the TLC region;

updating a first block erase stamp of a block in the SLC region according to an instant value of the first system erase stamp when the block in the SLC region is erased and updating a second block erase stamp of a block in the TLC region according to an instant value of the second system erase stamp when the block in the TLC region is erased; and determining the block age of the block in the SLC region by calculating a difference between a value of the first system erase stamp and a value of the first block erase stamp; and determining the block age of the block in the TLC region by calculating a difference between a value of the second system erase stamp and a value of the second block erase stamp.

3. The method of claim 1, wherein the erase count difference threshold is determined according to a percentage of an expected lifetime program/erase cycle of the plurality of blocks.

4. The method of claim 1, wherein the flash memory comprises a SLC region and a TLC region, and the step of setting the age limit comprises:

setting a first age limit according to a first erase count difference threshold for the SLC region and the number of overprovision blocks in the flash memory; and setting a second age limit according to a second erase count difference threshold for the TLC region and the number of overprovision blocks in the flash memory;

and the step of selecting the one or more candidate source blocks comprises:

selecting one or more blocks from the SLC region whose block ages exceed the first age limit as the one or more candidate source blocks; and selecting one or more blocks from the TLC region whose block ages exceed the second age limit as the one or more candidate source blocks.

5. A controller for controlling a flash memory and performing a wear-leveling operation on the flash memory, comprising:

a storage unit, configured to store information; and a processing unit, configured to execute program codes and refer to information stored in the flash memory or in the storage unit so as to perform following operations of:

determining a block age for each of a plurality of blocks in the flash memory according to a number of erase operations that have been performed on all of the plurality of blocks in the flash memory after the block is erased, wherein the block age reflects a duration of time that has elapsed since the block was last erased;

selecting one or more candidate source blocks from the plurality of blocks by comparing block ages of the plurality of blocks with an age limit, comprising:

determining a calculation result of dividing a sum of erase count differences of blocks in the flash memory by an erase count difference threshold, wherein the calculation result is indicative of the number of blocks containing hot data;

setting the age limit according a product of an average erase count factor and the calculation result; and selecting one or more blocks whose block ages exceed the age limit as the one or more candidate source blocks;

determining a source block from the one or more candidate source blocks according to either a lowest erase count among erase counts of the one or more candidate source blocks or an oldest block age among block ages of the one or more candidate source blocks; and performing the wear-leveling operation on the source block.

6. The controller of claim 5, wherein the flash memory comprises a single-level cell (SLC) region and a triple-level cell (TLC) region, and the processing unit executes the program codes to perform operations of:

recording a first system erase stamp and updating it only in response to erase operations performed over blocks in the SLC region; and recording a second system erase stamp and updating it only in response to erase operations performed over blocks in the TLC region;

updating a first block erase stamp of a block in the SLC region according to an instant value of the first system erase stamp when the block in the SLC region is erased and updating a second block erase stamp of a block in the TLC region according to an instant value of the second system erase stamp when the block in the TLC region is erased; and determining the block age of the block in the SLC region by calculating a difference between a value of the first system erase stamp and a value of the first block erase stamp; and determining the block age of the block in the TLC region by calculating a difference between a value of the second system erase stamp and a value of the second block erase stamp.

7. The controller of claim 5, wherein the erase count difference threshold is determined according to a percentage of an expected lifetime program/erase cycle of the plurality of blocks.

8. The controller of claim 5, wherein the flash memory comprises a SLC region and a TLC region, and the processing unit executes the program codes to perform operations of:

setting a first age limit according to a first erase count difference threshold for the SLC region and the number of overprovision blocks in the flash memory; and setting a second age limit according to a second erase count difference threshold for the TLC region and the number of overprovision blocks in the flash memory;

and the step of selecting the one or more candidate source blocks comprises:

selecting one or more blocks from the SLC region whose block ages exceed the first age limit as the one or more candidate source blocks; and selecting one or more blocks from the TLC region whose block ages exceed the second age limit as the one or more candidate source blocks.

9. A storage system, comprising:

a flash memory; and a controller for controlling the flash memory and performing a wear-leveling operation on the flash memory, the controller configured to perform operations of:

determining a block age for each of a plurality of blocks in the flash memory according to a number of erase operations that have been performed on all of the plurality of blocks in the flash memory after the block is erased, wherein the block age reflects a duration of time that has elapsed since the block was last erased;
selecting one or more candidate source blocks from the plurality of blocks by comparing block ages of the plurality of blocks with an age limit comprising:
  determining a calculation result of dividing a sum of erase count differences of blocks in the flash memory by an erase count difference threshold, wherein the calculation result is indicative of the number of blocks containing hot data;
  setting the age limit according a product of an average erase count factor and the calculation result; and
  selecting one or more blocks whose block ages exceed the age limit as the one or more candidate source blocks;
determining a source block from the one or more candidate source blocks according to either a lowest erase count among erase counts of the one or more candidate source blocks or an oldest block age among block ages of the one or more candidate source blocks; and
performing the wear-leveling operation on the source block.

* * * * *